(12) United States Patent
Dokumaci et al.

(10) Patent No.: US 7,476,914 B2
(45) Date of Patent: *Jan. 13, 2009

(54) METHODS TO IMPROVE THE SIGE HETEROJUNCTION BIPOLAR DEVICE PERFORMANCE

(75) Inventors: Omer H. Dokumaci, Wappingers Falls, NY (US); Gregory G. Freeman, Hopewell Junction, NY (US); Marwan H. Khater, Long Island City, NY (US); Rajendran Krishnasamy, Essex Junction, VT (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

This patent is subject to a terminal disclaimer.

(21) Appl. No.: 11/555,906

(22) Filed: Nov. 2, 2006

(65) Prior Publication Data

US 2008/0128861 A1    Jun. 5, 2008

Related U.S. Application Data

(63) Continuation of application No. 10/908,363, filed on May 9, 2005, now Pat. No. 7,144,787.

(51) Int. Cl.
*H01L 21/331* (2006.01)

(52) U.S. Cl. ........................ 257/197; 257/200; 438/312; 438/373

(58) Field of Classification Search ................. 438/312, 438/373; 257/197, 200
See application file for complete search history.

(56) References Cited

U.S. PATENT DOCUMENTS

| | | | |
|---|---|---|---|
| 6,265,275 B1 | 7/2001 | Marty et al. | |
| 6,534,371 B2 | 3/2003 | Coolbaugh et al. | |
| 6,563,146 B1 | 5/2003 | Yuki et al. | |
| 7,144,787 B2 * | 12/2006 | Dokumaci et al. | 438/312 |
| 7,170,083 B2 * | 1/2007 | Freeman et al. | 257/12 |
| 2002/0177253 A1 | 11/2002 | Johnson et al. | |
| 2003/0173580 A1 | 9/2003 | Coolbaugh et al. | |
| 2004/0207046 A1 * | 10/2004 | Babcock et al. | 257/575 |
| 2005/0023642 A1 | 2/2005 | Heinemann et al. | |

OTHER PUBLICATIONS

Osten, et al., "Carbon Doped SiGe Heterojunction Bipolar Transistors for High Frequency Applications", Institute for Semiconductor Physics, IEEE, 1999, pp. 109-116.

\* cited by examiner

*Primary Examiner*—Trung Dang
(74) *Attorney, Agent, or Firm*—Scully, Scott, Murphy & Presser, P.C.; Richard M. Kotulak, Esq.

(57) ABSTRACT

Methods of boosting the performance of bipolar transistor, especially SiGe heterojunction bipolar transistors, is provided together with the structure that is formed by the inventive methods. The methods include providing a species-rich dopant region comprising C, a noble gas, or mixtures thereof into at least a collector. The species-rich dopant region forms a perimeter or donut-shaped dopant region around a center portion of the collector. A first conductivity type dopant is then implanted into the center portion of the collector to form a first conductivity type dopant region that is laterally constrained, i.e., confined, by the outer species-rich dopant region.

7 Claims, 8 Drawing Sheets

METHODS TO IMPROVE THE SIGE HETEROJUNCTION BIPOLAR DEVICE PERFORMANCE

RELATED APPLICATIONS

This application is a continuation of U.S. application Ser. No. 10/908,363 filed May 9, 2005 now U.S. Pat. No. 7,144,797.

FIELD OF THE INVENTION

The present invention generally relates to bipolar transistors and, more particularly, to methods of fabricating a substrate for a heterojunction bipolar transistor (HBT) in which ion implantation is employed to improve the performance of the bipolar device. The present invention also relates to a substrate that can be used for providing a bipolar device that exhibits improved device performance.

BACKGROUND OF THE INVENTION

Bipolar transistors are devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

SiGe HBT technology has come of age as an important semiconductor technology for both wired and wireless telecommunication applications because of its superior analog and RF performance, together with its complementary metal oxide semiconductor (CMOS) integration capability. By employing bandgap engineering, SiGe HBTs outperform Si BJTs in nearly every important performance metric and, in several areas, provide improved performance over III-V compound semiconductor HBTs.

The incorporation of carbon, C into the SiGe heterojunction bipolar device's base region by using an epitaxy process has been carried out in the prior art to prevent the out-diffusion of boron into the adjacent emitter, collector or both the emitter and collector. The foregoing is disclosed, for example, in H. J. Osten, et al., "Carbon Doped SiGe Heterojunction Bipolar Transistor for High Frequency Applications", IEEE/BCTM, 1999, p. 169.

Both boron, B and phosphorus, P diffusion in silicon occurs via an interstitial mechanism and the diffusion is proportional to the concentration of silicon self-interstitials formed by dopant implantation, oxidation and other like processes. Arsenic enhanced diffusion is caused by vacancies. Diffusion of carbon out of a carbon-rich region causes an under-saturation of silicon self-interstitials by a mechanism known as "kick-out". As a result, the interstitial assisted dopant diffusion in these regions will be suppressed.

U.S. Pat. No. 6,534,371 B2 to Coolbaugh, et al., entitled "C Implant for Improved SiGe Bipolar Yield" provides a method in which C is implanted into various regions or parts of the SiGe bipolar device to control or prevent bipolar shorts between the emitter, base and the collector.

Despite the prior art mentioned above, there is a continued need to boost the performance of bipolar devices, especially SiGe HBTs. In particular, there is a need for providing a new and improved method for improving the performance of bipolar devices.

SUMMARY OF THE INVENTION

One object of the present invention is to provide a method of fabricating a bipolar transistor, particularly a HBT, in which bipolar performance is improved. By "improved bipolar performance", it is meant that an increase in the overall performance of the bipolar transistor including higher maximum oscillation frequency, higher current gain, and lower collector-base capacitance can be obtained using the method of the present invention.

Another object of the present invention is to provide a method of fabricating a bipolar transistor in which the lateral diffusion of a selective collector implant (SIC), such as a n-type dopant, is substantially reduced thereby increasing the performance boost.

A further object of the present invention is to provide a method of fabricating a bipolar transistor that exhibits a substantial decrease in collector-base capacitance, as compared to a conventional HBT.

A yet further object of the present invention is to provide a method of fabricating a bipolar transistor by performing a rapid thermal anneal (RTA) after implanting a species such as C so as to bring substantially all the interstitial carbon ($C_i$) into a substitutional carbon ($C_s$) in the silicon lattice to trap additional interstitials. The bipolar transistor performance boost increases with increasing temperature of the RTA.

An even further object of the present invention is to provide a method of fabricating a bipolar transistor using processing steps that are compatible with existing bipolar and CMOS processing steps.

The above objects and advantages are achieved in the present invention by incorporating a species such as carbon, a noble gas or mixtures thereof into at least the collector by using a blanket or masked process that is capable of providing a species-rich dopant region and then implanting a first conductivity type dopant (n- or p-type) into the collector to form a dopant region that is laterally constrained by the species-rich dopant region. That is, the species-rich dopant region forms an outer perimeter around the inner dopant region containing the first conductivity type dopant. Thus, the inventive structure has a dopant region that consist of a donut in which the outer perimeter comprises the species-rich dopant region and the inner region comprising the hole of the donut contains the first conductivity type dopant.

Specifically, and in broad terms, the present invention provides a semiconductor structure useful as the substrate of a bipolar transistor that includes:

a Si-containing substrate comprising a collector having an outer species-rich dopant region that provides a lateral perimeter around an inner dopant region that includes a first conductivity type dopant, said outer species-rich dopant region laterally confining said first conductivity type dopant within said inner dopant region.

The structure of the present invention can further include a base located above the collector, optionally a raised extrinsic base, and an emitter, which is in contact with said base through an emitter window formed in an insulating layer.

In addition to the structure described above, the present invention also provides a method of fabricating such a semiconductor structure. The method of the present invention comprises the steps of:

providing an outer species-rich dopant region comprising C, a noble gas, or mixtures thereof into at least a collector, said outer species-rich dopant region forms a perimeter region around a center portion of said collector; and implanting a first conductivity type dopant into said center portion of said collector to form a inner dopant region comprising said first conductivity type dopant that is laterally constrained by said outer species-rich dopant region.

In one embodiment of the present invention, the species-rich dopant region is formed by a blanket ion implantation process and annealing. In another embodiment, the species-rich dopant region is formed by a masked ion implantation process. In addition to ion implantation, the species-rich dopant region can be formed by in-situ doping or, when C is used, epitaxial growth.

In one embodiment of the present invention, C is used as the species to reduce phosphorus transient-enhanced diffusion. In another embodiment of the present invention, a noble gas such as Xe or Ar is used to suppress enhanced diffusion of As in the collector, In yet another embodiment of the present invention, C and a noble gas, particularly Xe or Ar, are used to suppress enhanced diffusion of phosphorus (P) having a high concentration (on the order of about 5E19 or greater) in the collector.

In some embodiments, at least one of fluorine, nitrogen or oxygen can be co-incorporated with one of the species mentioned above. The co-incorporation of fluorine or nitrogen is typically used to reduce As and high concentration P, while the co-incorporation of oxygen is typically used to reduce As diffusion.

The first conductivity type dopant can be a n-type dopant (such as P, As or Sb) or a p-type dopant (such as B, Al, Ga, In or Tl). The choice of the first conductivity type dopant is determined by the type of bipolar device being formed. When a npn bipolar transistor is being formed, the first conductivity type dopant is a n-type dopant. When a pnp bipolar transistor is being formed, the first conductivity type dopant is a p-type dopant. Since npn bipolar transistors provide higher-frequency operation and higher speed-performances than pnp bipolar transistors, it is preferred that the first conductivity type dopant is a n-type dopant.

The above processing steps can be implemented with any existing bipolar transistor process flow. Particularly, the method of the present invention can be used to form a substrate for a SiGe HBT.

The method of the present invention results in a bipolar transistor performance boost which is obtained by providing a device having a completely suppressed lateral diffusion of dopants than heretofore possible with prior art bipolar transistors.

The above method represents one embodiment of the present invention. In another embodiment, the order of processing steps is switched such that the first conductivity type dopant region is formed first, followed by the species-rich dopant region.

BRIEF DESCRIPTION OF THE DRAWINGS

FIG. 4A after base formation, and FIG. 4B after raised extrinsic base and emitter formation.

DETAILED DESCRIPTION OF THE INVENTION

Figure 1A:
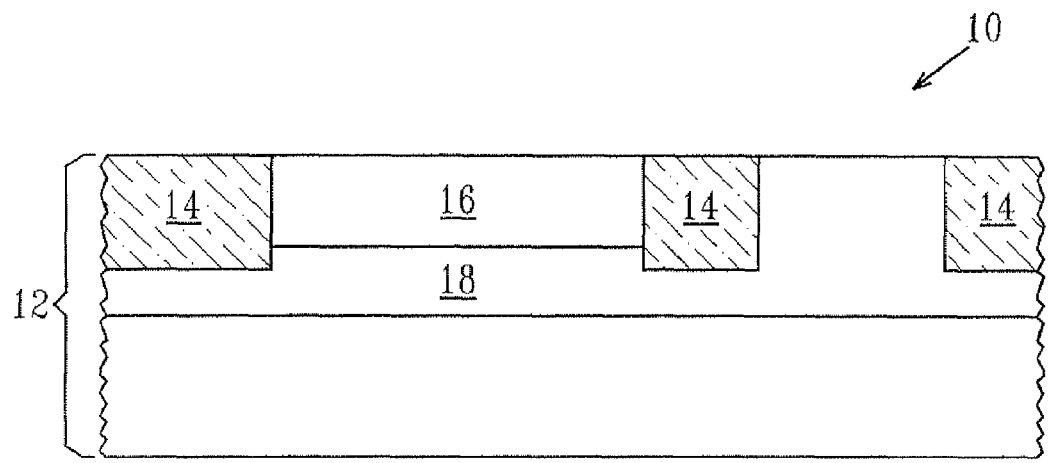
FIGS. 1A-1F are pictorial representations (through cross sectional views) depicting the basic processing steps of one embodiment of the present invention. In these drawings, the outer species-rich dopant region and the inner dopant region have been tilted to emphasize the donut shaped structure that is formed.

The present invention, which provides methods to improve the bipolar device performance as well as the resultant structure produced by the inventive methods, will now be described in more detail by referring to the drawings that accompany the present application. The drawings are provided for illustrative purposes and are thus not drawn to scale.

FIGS. 1A-1F are pictorial representations illustrating the basic processing steps that are employed in one embodiment of the present invention for forming a semiconductor structure which can be used to boost the performance of a bipolar transistor. FIG. 1A shows an initial structure 10 that can be used in the present invention. The initial structure 10 includes a Si-containing substrate 12 having trench isolation regions 14 formed therein. The Si-containing substrate 12 comprises any semiconductor material that includes silicon. Illustrative examples of such Si-containing materials that can be used as substrate 12 include, but are not limited to: Si, SiGe, silicon-on-insulators (SOIs), or silicon germanium-on-insulators (SGOIs). Alternatively, the Si-containing substrate 12 may be a Si-containing layer such as epitaxial Si or amorphous Si formed atop a semiconductor substrate. The Si-containing substrate 12 may include various doping or well regions.

The Si-containing substrate 12 also includes a collector 16 and a subcollector 18 located in the Si-containing substrate 12. The collector 16 and the subcollector 18 are formed by ion implantation and annealing. The conditions for the implantation and anneals used in forming the collector 16 and subcollector 18 are well known to those skilled in the art.

The trench isolation regions 14 are formed using techniques well known in the art including, for example, lithography, etching, optionally forming a trench liner, trench filling and planarization. The trench fill material includes a trench dielectric such as an oxide.

Figure 1B:
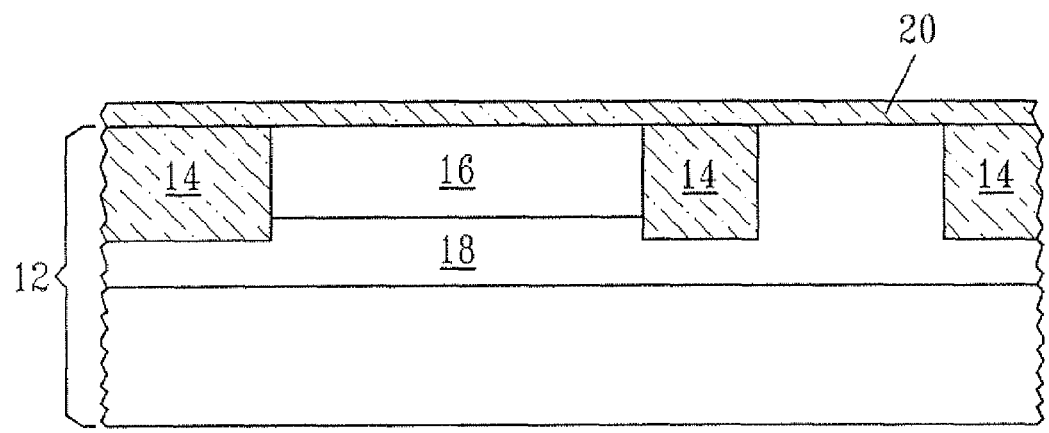

After forming the initial structure 10 shown in FIG. 1A, a protective film 20 such as an oxide, nitride, oxynitride or combinations thereof, preferably an oxide, is then formed across the entire substrate 12 providing the structure shown in FIG. 1B. The protective film 20 is formed via a deposition process such as, for example, chemical vapor deposition (CVD), plasma-enhanced chemical vapor deposition (PECVD), chemical solution deposition, evaporation, atomic layer deposition and other like deposition processes. Alternatively, the protective film 20 can be formed by a thermal oxidation, nitridation or oxynitridation process. The thickness of the protective film 20 can vary depending on the type of material being deposited as well as the process that was used to deposit the same. Typically, the protective film 20 has a thickness from about 10 to about 25 nm.

In some cases, it is possible to pattern the protective film 20 at this point of the present invention by lithography and a dry etching process. Although such an embodiment is possible, it is not depicted in FIGS. 1A-1F. FIG. 3B shows the case in which a patterned protective film 20 is used.

A species comprises C, a noble gas, or a mixture thereof is then incorporated into at least the collector 16. In this illustrated embodiment of the present invention, a blanket ion implantation (with or without a patterned protective film) can be used. In another embodiment of the present invention (to be described in greater detail herein below) a masked ion implantation process is used. In addition to ion implantation, the species can be incorporated into at least the collector 16 utilizing an in-situ gas phase doping process. Alternatively, and when the species is C, epitaxy can be used to incorporate C selectively into at least the collector.

The term "noble gas" includes a gas that contains an element which either is completely unreactive or reacts only to a limited extent with other elements. Examples of noble gases that that can be used include He, Ar, Ne, Xe, Kr, or mixtures thereof. In one embodiment, the species used in this step of the present invention comprises C. In another embodiment, the species is a noble gas, particularly Xe or Ar. In yet another embodiment, a mixture of C and a noble gas (preferably Xe/C or Ar/C) is employed.

Figure 1C:
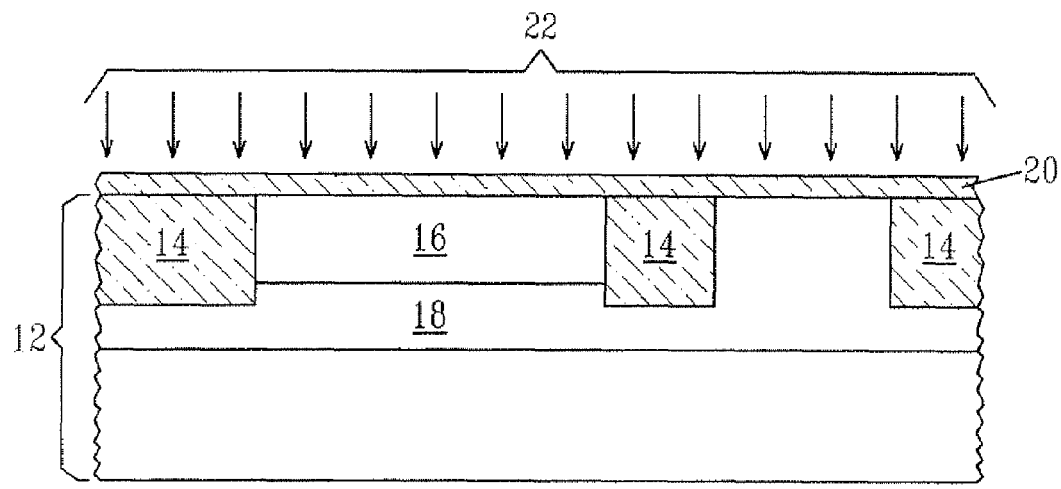

The structure during the foregoing incorporation step is shown, for example, in FIG. 1C. In the drawing, reference numeral 22 denotes the species being incorporated into the Si-containing substrate 12. In accordance with the present invention, the incorporation of the species 22 occurs into at least the collector 16. In some embodiments, the species 22 is incorporated into both the collector 16 and the subcollector 18.

When ion implantation is used as the technique to incorporate the species 22 into at least the collector 16, the implant conditions (dose/energy) used are capable of forming a species-rich dopant region 24 within at least the collector 16. The implant of species 22 is typically performed using a dose from about 1E13 to about 5E15 $cm^{-2}$, with a dosage from about 1E14 to about 1E15 $cm^{-2}$ being more typical. In addition to the dose range mentioned above, the implant of the species 22 is performed at an implant energy from about 10 to about 150 keV, with an implant energy from about 40 to about 70 keV being even more typical. The dopant concentration of species 22 that is implanted at this point of the present invention is from about 1E18 to about 5E20 $atoms/cm^3$.

In some embodiment of the present invention, it is possible to co-incorporate one of fluorine, nitrogen or oxygen into at least the collector 16. The co-incorporation can occur at the same time as the incorporation of the species 22, or it can occur before or after the incorporation of the species 22. The foregoing additional elements can be incorporated by ion implantation (alone or with the species 22) or by gas phase doping (alone or with the species 22). The concentration of the foregoing elements that can be incorporated into at least the collector 16 at this point of the present invention is from about 1E19 to about 1E21 $cm^3$.

Figure 1D:
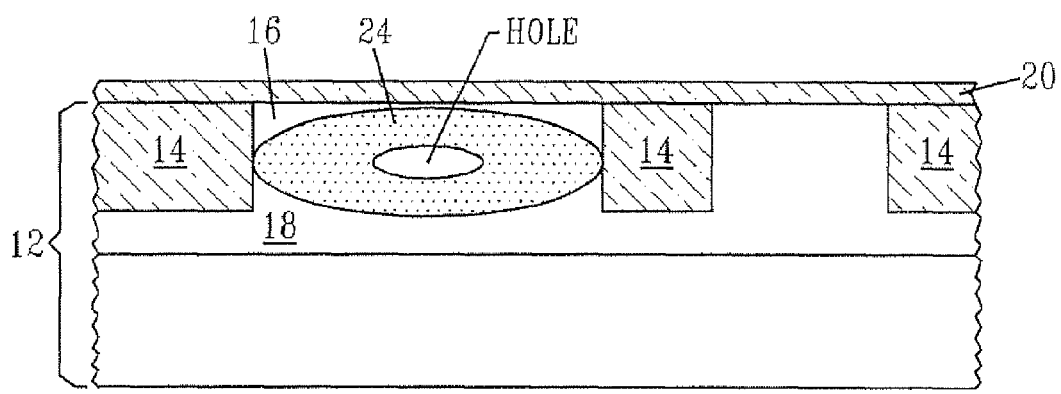

After the incorporation of at least the species 22, a rapid thermal anneal (RTA) step, which is used to activate the species 22 within the species-rich dopant region 24, is employed. The resultant structure that is formed after the RTA step is shown in FIG. 1D. The RTA step employed to active at least the implanted species 22 is performed at a temperature from about 600° C. or above, with a temperature from about 1000° to about 1100° C. being more typical. The RTA step is performed in an inert ambient such as He, Ar, Ne, Xe, Kr or mixtures thereof. The RTA step is performed for a time period of about 1 minute or less, with a time period of about 30 seconds or less being more typical. In the embodiment depicted, the RTA also causes diffusion of at least the incorporated species 22 outward from a central portion of the collector 16. It has been observed that for higher anneal temperatures a greater boost in device performance is obtained. The annealing step provides a species-rich dopant region 24 that is located around the perimeter of the collector 16. Specifically, the annealing step forms a species-rich dopant region 24 that has a hole portion that is located proximately in the center of the collector 16. That is, the anneal forms a donut shaped species-rich dopant region 24 that laterally surrounds a center portion of the collector 16. It is emphasized that in these drawings, the dopant regions have been tilted to emphasize the structure that is being formed.

In addition to RTA, the present invention also contemplates other annealing processes such as, spike annealing or laser annealing. These alternative anneals can be performed within the temperature range mentioned above for the RTA.

Figure 1E:
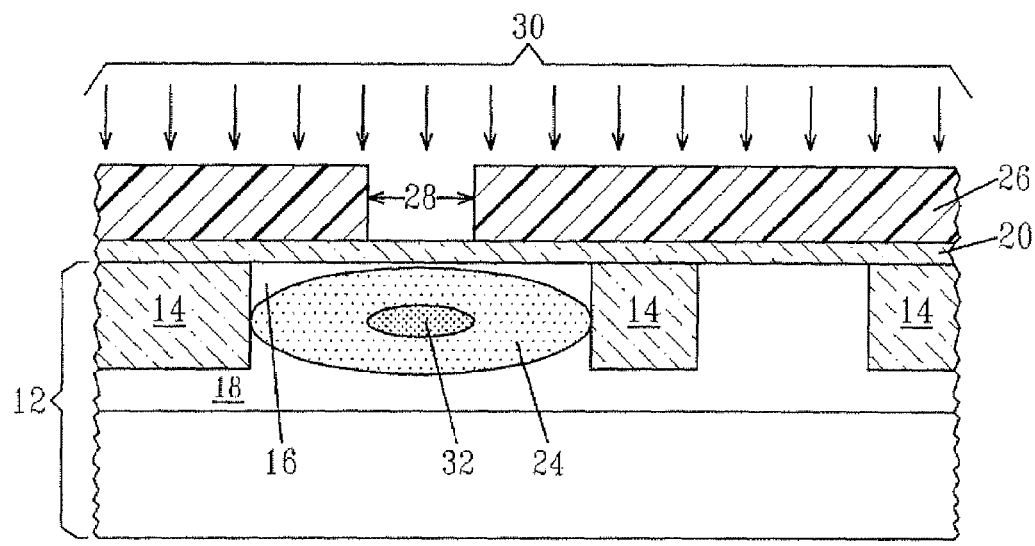

Next, and as shown in FIG. 1E, an implant mask 26 having at least one opening 28 is formed on the structure and thereafter ions 30 having a first conductivity type (n or p), are then selectively implanted into the structure. Preferably, ions 30 are n-type ions such as As or P. In the embodiment illustrated, the ions 30 are being selectively implanted into the collector 16 through opening 28. The ions 30 can also be implanted into the underlying portions of the subcollector 18.

The ions 30 are selectively implanted at this stage of the present invention to provide a dopant region 32 of the first conductivity type at or near the center of the species-rich dopant region 24, i.e., in the hole region. See, FIG. 1E. As shown, the dopant region 32 is at the center of the donut shaped species-rich dopant region 24 and thus species-rich dopant region 24 protects the inner dopant region 32. Specifically, the species-rich dopant region 24 forms an outer perimeter that laterally surrounds the inner dopant region 32 and it serves as a shield for the inner dopant region 32. Such a configuration of dopant regions substantially reduces (and thus controls) the lateral diffusion of dopants from dopant region 32. That is, the outer species-rich dopant region 24 maintains the dopant ions of the first conductivity type within dopant region 32. The 'squeezing' affect boosts the device performance by reducing the collector-base overlap and therefore reduces parasitic capacitance, permitting higher Fmax.

The implant mask 26 having at least one opening 28 is formed by first forming a mask material such as a photoresist or hardmask onto the structure shown in FIG. 1D via a deposition process such as CVD, PECVD or spin-on coating.

Photolithography is then employed to provide a pattern to the implant mask 26. The photolithography process includes an exposure step and a development step. Etching can be used, if the material to pattern is a hardmask.

The implant of the dopant of the first conductivity type is carried out using an ion dosage from about 1E12 to about 1E15 cm$^{-2}$, with an ion dose from about 1E13 to about 1E14 cm$^{-2}$ being more typical. The second implant is performed using an implant energy from about 10 to about 200 keV, with an implant energy from about 50 to about 100 keV being more typical.

After performing this implant step, the implant mask is removed from the structure utilizing a conventional stripping process or by planarization. The resultant structure 50 is shown, for example, in FIG. 1F. The structure 50, minus the protective layer 20, is useful as a substrate for a bipolar device. The protective layer 20 is removed utilizing chemical mechanical polishing or a selective etching process.

Figure 1F:
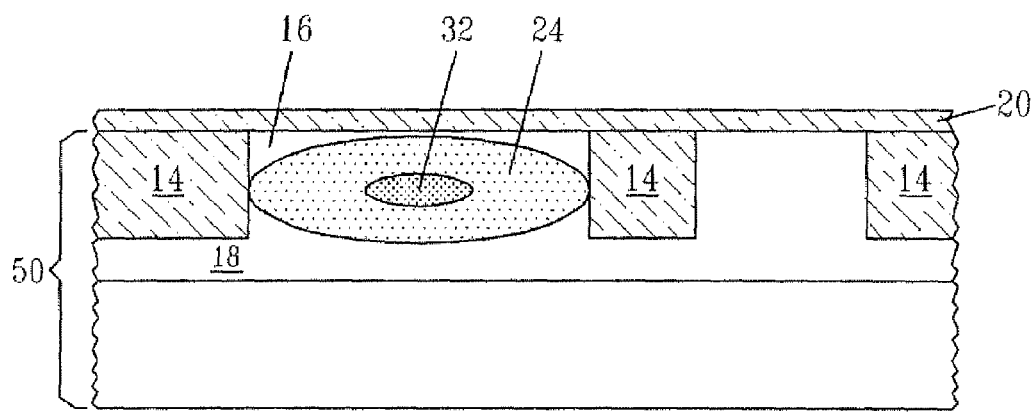
Figure 2A:
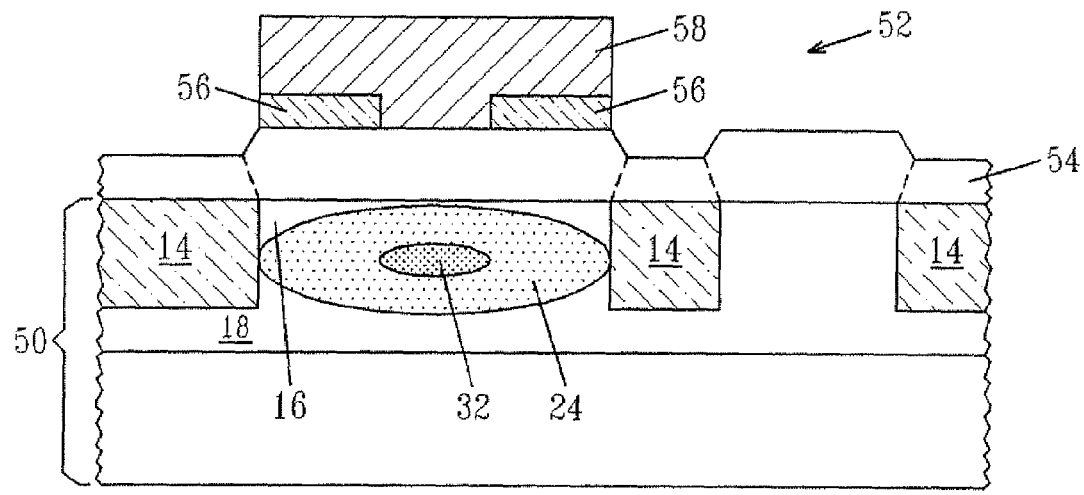
FIGS. 2A-2B are pictorial representations (through cross sectional views) illustrating a bipolar device which includes the structure shown in FIG. 1F as the substrate.
Figure 2B:
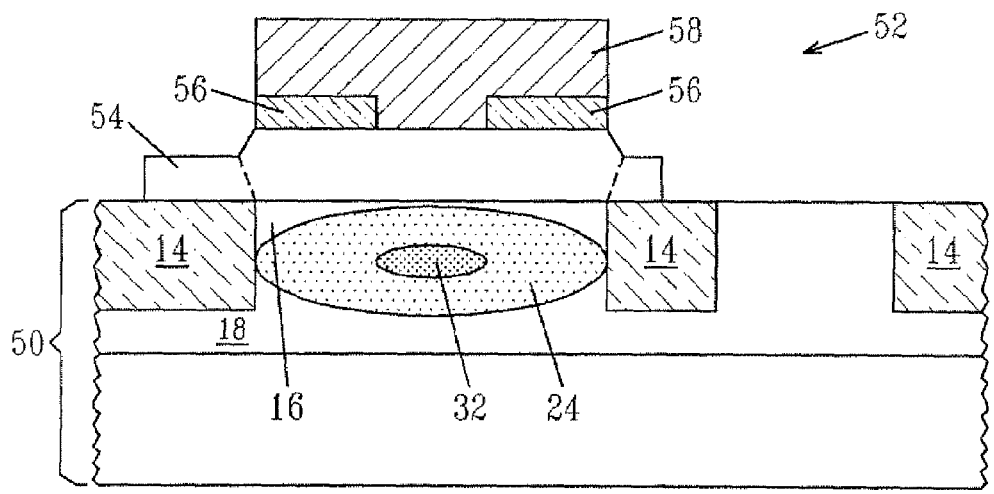

FIGS. 2A-2B show a possible bipolar transistor 52 that can be formed on the structure 50 shown in FIG. 1F; FIG. 2A prior to patterning of layer 54 and FIG. 2B are patterning. In addition to structure 50, the bipolar transistor 52 includes a base 54, insulating regions 56 and emitter 58 which is in contact with a portion of the base 54 in an emitter window formed in the insulating regions 56. The bipolar transistor 52 can be formed utilizing any process that is well known to those skilled in the art. The bipolar transistor 52 can include a raised extrinsic base or the raised extrinsic base can be absent. The structure shown in FIGS. 2A-2B does not include a raised extrinsic base.

Typically, a base 54 is first formed atop the entire structure by a low temperature epitaxial growth process (typically 450°-850° C.). The base 54, which may comprise Si, SiGe or a combination of Si and SiGe, is monocrystalline on top of exposed portions of the Si— substrate 12 and polycrystalline on top of the trench isolation regions 14. The region in which polycrystalline changes over to monocrystalline (represented by the dashed lines within region 54) is referred to as the facet region. The base 54 that is formed at this step of the present invention typically has a thickness after epitaxial growth from about 40 to about 600 nm. Note that the base 54 is typically thicker atop the Si-containing substrate 12 than atop the isolation trench regions 14.

The bipolar transistor structure also includes insulating regions 56 that is formed atop the upper horizontal surfaces of the base 54 utilizing a conventional deposition process such as CVD. The insulating layer typically has a thickness after formation from about 5 to about 50 nm. After depositing the insulating layer, the insulating layer is patterned via lithography and etching which forms insulating regions 56 that have an emitter window opening located therebetween.

A doped semiconducting layer which becomes the emitter 58 of the bipolar device 52 is then formed. The doped semiconductor layer, i.e., the emitter 58, comprises polysilicon, Si or SiGe. The doped layer 58 can be a layer with a variable doping concentration, or Ge composition that can be grown in a state-of-the-art low temperature epitaxy system. The doped layer 58 may also be formed by either an in-situ doped deposition process or by first depositing a polysilicon, Si or SiGe layer and then doping by ion implantation and annealing. In a preferred embodiment of the present invention, an in-situ doping deposition process is utilized. The doped layer 58 typically has a thickness from about 20 to about 400 nm.

After deposition, the doped semiconductor layer can be patterned by lithography and etching to provide the emitter 58 shown in FIG. 2A. Finally, the SiGe or Si base layer is patterned using techniques well known in the art, as shown in FIG. 2B.

The above sequence of processing steps represents one preferred embodiment of the present invention. In this one preferred embodiment, the species-rich dopant region having a hole in the middle therein is first formed and then the first conductivity type dopant region is implanted into the hole. In another embodiment of the present invention, the first conductivity type dopant region is first selectively implanted into the collector. After this implant, the species is incorporated and then an RTA is performed which forms the species-rich dopant region around the perimeter (lateral direction) of the first conductivity type dopant. In this embodiment, the RTA causes a greater diffusion of the species than the first conductivity type dopant.

In another preferred embodiment of the present invention, a mask is used to incorporate the species 22 selectively into at least the collector 16. This embodiment of the present invention is depicted in FIGS. 3A-3E. FIGS. 4A and 4B illustrate a typical process flow for fabricating a HBT device on the structure shown in FIG. 3E.

Figure 3A:
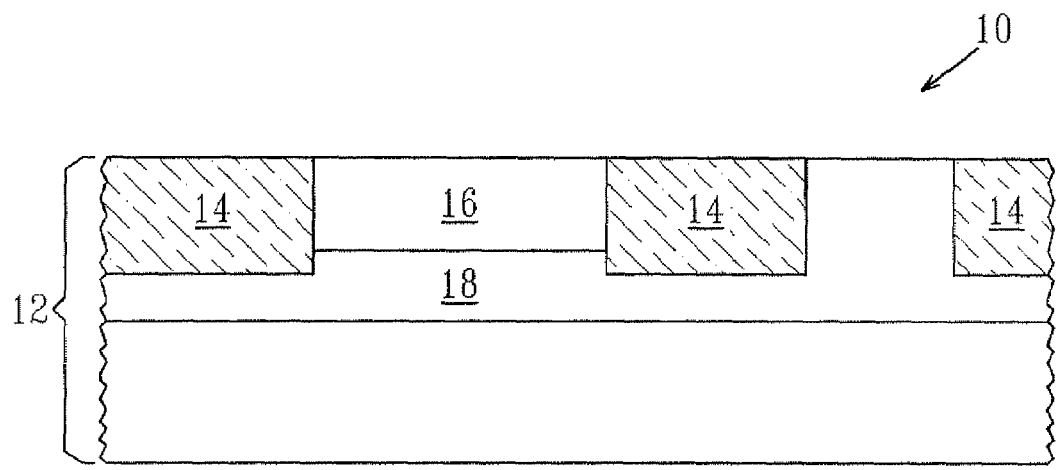
FIGS. 3A-3E are pictorial representations (through cross sectional views) depicting the basic processing steps employed in a second embodiment of the present invention. In this embodiment, no tilting of the outer species-rich dopant region and the inner dopant region is shown.
Figure 3B:
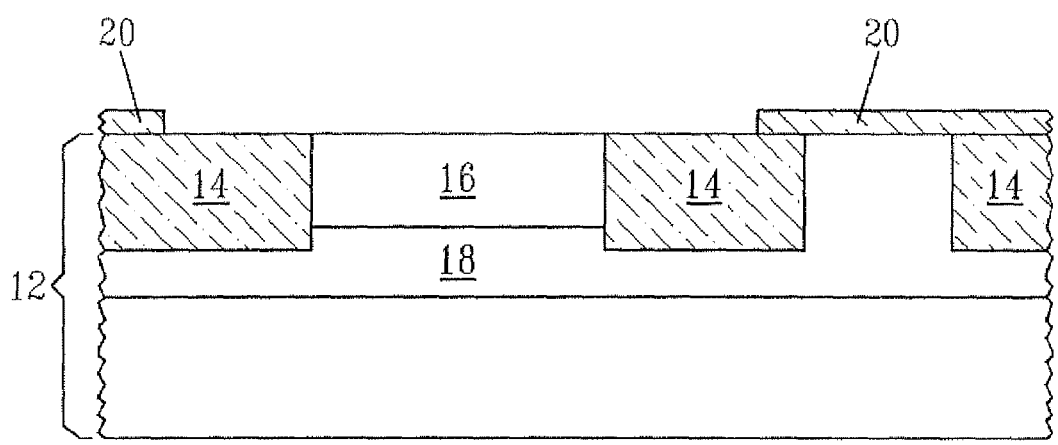
Figure 4A:
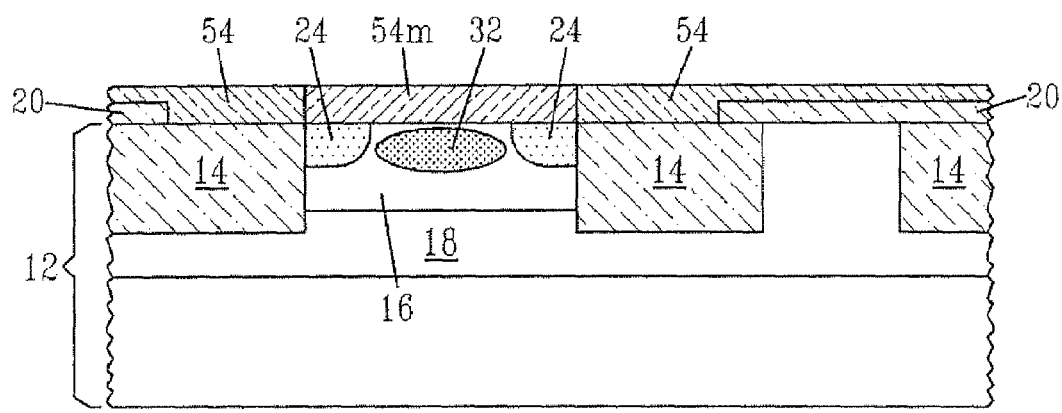
FIGS. 4A-4B are pictorial representations (through cross sectional views) illustrating a bipolar device which includes the structure shown in FIG. 3 E as the substrate.
Figure 4B:
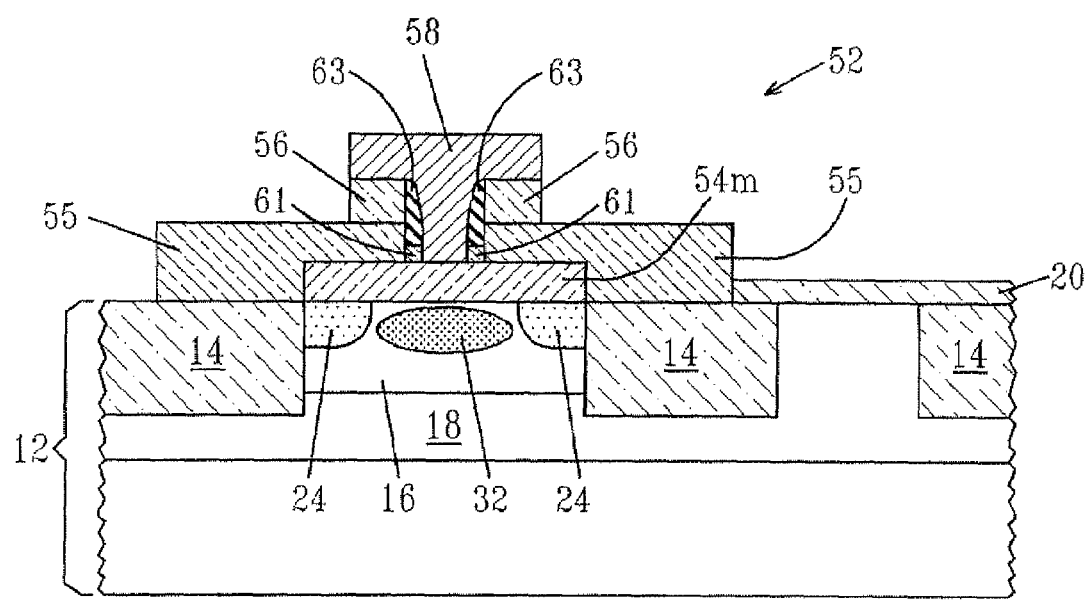

Reference is first made to the initial structure 10 shown in FIG. 3A. The initial structure 10, which is the same as that shown in FIG. 1A, includes a Si-containing substrate 12, trench isolation regions 14, collector 16 located between two adjacent trench isolation regions and subcollector 18. The materials and processing steps described above in the first embodiment in regard to FIG. 1A are applicable here as well. Hence, the above description regarding the materials and processing used in forming the structure shown in FIG. 1A are incorporated herein by reference.

A patterned protective film 20 is then formed atop the surface of the Si-containing substrate 12 by deposition, lithography and etching. The resultant structure including the patterned protective film 20 is shown in FIG. 3B. The patterned protective film 20 includes the same materials as those described above in the first embodiment. Also, the protective film 20 can be formed utilizing one of the techniques mentioned above in forming the blanket layer shown in FIG. 1B. The lithography step and etching step used to pattern the blanket protective film includes depositing a resist, exposing the resist to a pattern of radiation, developing the pattern into the resist and dry etching.

In one embodiment (not shown), it is possible to incorporate the species 22 using the structure shown in FIG. 3B via a blanket ion implantation process. In the illustrated embodiment, a patterned mask 25 is formed on the Si-containing substrate 12 so as to protect a center portion of the collector 16. As shown, the patterned mask 25 protects the center portion of the collector 16, while leaving the end portions of the collector 16 that are adjacent to the trench isolation region 14 unprotected. The patterned mask 25 comprises a hardmask material such as an oxide or nitride, or it comprises a photoresist material. The patterned mask 25 is formed by deposition, lithography, and optionally etching. The optional etching step is used when the mask material comprises a hardmask material. The patterned mask 25 can have vertical sidewalls or it can have slightly tapered sidewalls. Tapered sidewalls lead to a structure in which the edge of the outer species-rich dopant region that is furthest from the trench isolation region is slightly tapered.

Figure 3C:
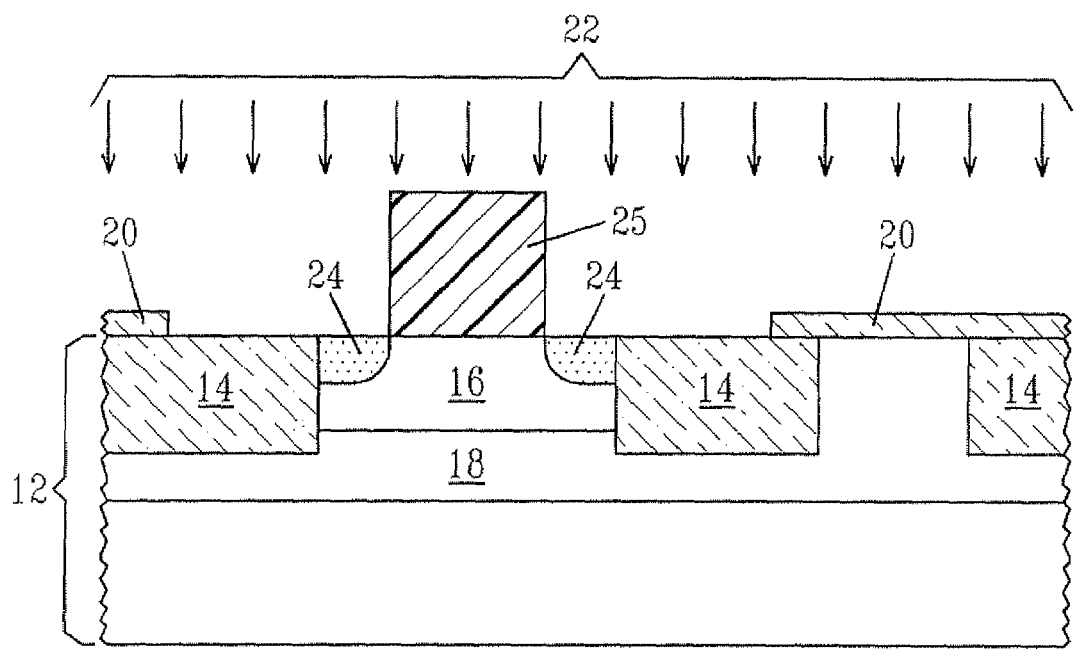

Species 22 are then incorporated into the structure containing patterned mask 25 as is shown in FIG. 3C. The species 22 includes one of the species mentioned in the first embodiment. It is also possible to co-incorporate one of fluorine, nitrogen or oxygen at this point of the present invention as well. The previously described techniques used to incorporate species 22 can also be used in this embodiment as well. Also, this embodiment contemplates any of the combination of the species 22 mentioned above.

It is noted that in the drawings of this embodiment a true cross-sectional view is shown. From a top-down view, region 24 would surround a center portion of the collector 16.

The use of the patterned mask 25 is advantageous since no species are formed in the center portion of the collector 16. Instead, and as is illustrated, the species are contained within doping species-rich region 24 which is aligned on one side to the edge of the patterned mask 25 and on the other side to the edge of the trench isolation region 14. A rapid thermal anneal step can be performed as described above to activate the dopants within region 24 at this point of the present invention.

Figure 3D:
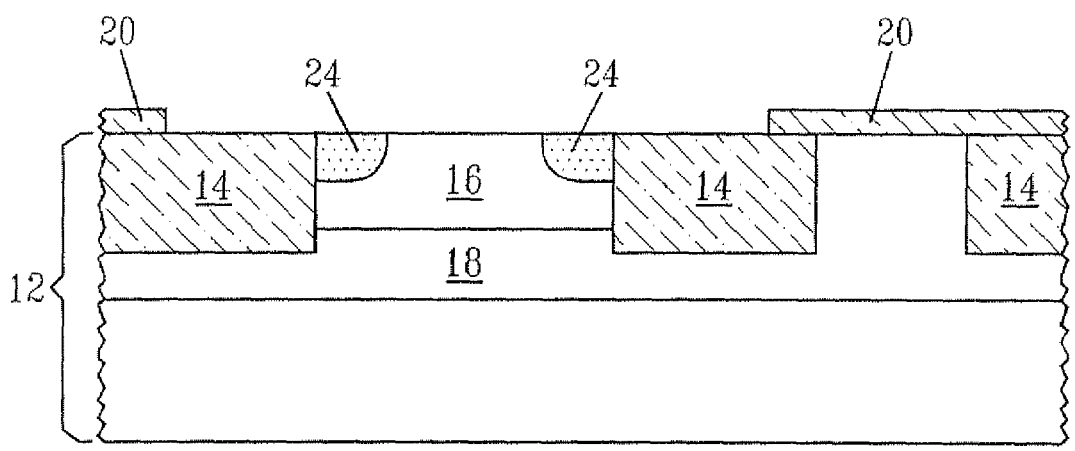
Figure 3E:
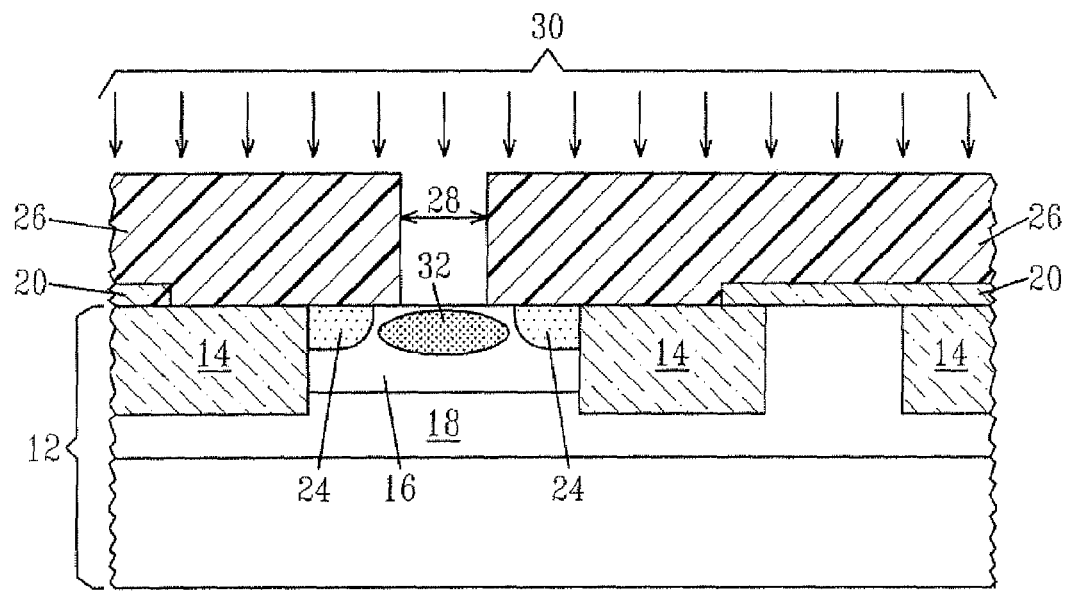

Next, and as shown in FIG. 3D, the patterned mask 25 is stripped from the structure by a conventional stripping process or etching. An, implant mask 26 having at least one opening 28 is formed providing the structure shown in FIG. 3E. The implant mask 26 having opening 28 is formed utilizing the same technique as described in the first embodiment (see above description concerning FIG. 1E). As shown, the implant mask 26 protects the previously formed species-rich dopant region 24, while exposing a center portion of the collector 16. FIG. 3E also shows ions 30 being selectively implanted into the center portion of the collector 16 though hole 28 in the implant mask 26. This implant is similar to the one described above, in connection with FIG. 1E. Thus, the above description regarding the selective collector implant is incorporated herein by reference. As was the case in the first embodiment, a dopant region 32 of a first conductivity type ion (n- or p-type, preferably n-type) is formed in the collector such that the dopant region 32 is laterally confined by the species-rich dopant region 26. That is, the species-rich dopant region 24 forms a lateral perimeter around doping region 32 which effectively suppresses lateral diffusion of dopants out of the dopant region 32.

A bipolar transistor 52 can be formed atop the structure shown in FIG. 3E (after removing the implant mask 26) utilizing any standard process that is capable of forming a bipolar transistor. FIGS. 4A and 4B show the bipolar transistor after base formation and forming the remaining elements of the transistor. The bipolar transistor 52 shown in FIGS. 4A and 4B is similar to that shown in the previous embodiment except that a raised extrinsic base and a pedestal region are formed; reference to the above description for specific processing details and materials is thus made. The structure shown in FIG. 4A includes a base 54 including monocrystalline base 54m. The final structure shown in FIG. 4B includes a raised extrinsic base 55, a patterned insulating layer 56, oxide layer 61, spacer 63, and a doped semiconducting material 58, which forms the emitter of the bipolar transistor device 52.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

What is claimed is:

1. A semiconductor structure comprising:
a Si-containing substrate comprising a collector having an outer species-rich dopant region that provides a lateral perimeter around an inner dopant region that includes a first conductivity type dopant, said outer species-rich dopant region laterally confining said first conductivity type dopant within said inner dopant region, wherein said outer species rich dopant region has at least one outer edge that is tapered.

2. The semiconductor structure of claim 1 wherein said outer species-rich dopant region comprises C, a noble element, or a mixture thereof.

3. The semiconductor structure of claim 2 wherein said outer species-rich dopant region comprises C.

4. The semiconductor structure of claim 1 wherein said outer species-rich dopant region further comprises at least one of fluorine, oxygen or nitrogen.

5. The semiconductor structure of claim 1 wherein said outer species-rich dopant region has a dopant concentration from about 1E18 to about 5E20 atoms/cm$^3$.

6. The semiconductor structure of claim 1 further comprising a bipolar transistor located on said collector.

7. The semiconductor structure of claim 6 wherein said bipolar transistor comprises a base, an insulating region having an emitter window opening, and an emitter which contacts said base through said emitter window opening.

* * * * *